(12) United States Patent
Cheng et al.

(10) Patent No.: US 11,231,606 B2
(45) Date of Patent: Jan. 25, 2022

(54) CONDUCTIVE SUBSTRATE, MANUFACTURING METHOD THEREOF AND DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 926 days.

(21) Appl. No.: 15/776,226

(22) PCT Filed: Nov. 15, 2017

(86) PCT No.: PCT/CN2017/111047
§ 371 (c)(1),
(2) Date: May 15, 2018

(87) PCT Pub. No.: WO2018/166228
PCT Pub. Date: Sep. 20, 2018

(65) Prior Publication Data
US 2021/0173250 A1    Jun. 10, 2021

(30) Foreign Application Priority Data
Mar. 15, 2017   (CN) .......................... 201710154211.4

(51) Int. Cl.
*G02F 1/1333* (2006.01)
*C08K 3/04* (2006.01)

(52) U.S. Cl.
CPC ........ *G02F 1/133305* (2013.01); *C08K 3/041* (2017.05); *G02F 2202/36* (2013.01)

(58) Field of Classification Search
None
See application file for complete search history.

(56) References Cited

U.S. PATENT DOCUMENTS

| 6,356,323 B1 | 3/2002 | Petruchik |
| 7,532,290 B2 | 5/2009 | Majumdar et al. |

(Continued)

FOREIGN PATENT DOCUMENTS

| CN | 101587397 A | 11/2009 |
| CN | 101620491 A | 1/2010 |

(Continued)

OTHER PUBLICATIONS

International Search Report of PCT/CN2017/111047 in Chinese, dated Jan. 9, 2018 with English translation.

(Continued)

*Primary Examiner* — Richard H Kim
(74) *Attorney, Agent, or Firm* — Collard & Roe, P.C.

(57) ABSTRACT

Embodiments of the present invention provide a conductive substrate, a manufacturing method thereof and a display device. The conductive substrate includes a base substrate and a first conductive layer and a second conductive layer disposed on the base substrate, wherein the first conductive layer and the second conductive layer contact with each other, the first conductive layer is configured to be electrically connected with separated parts after the second conductive layer is fractured, and the first conductive layer includes a composite material layer or a nanowire conductive network layer.

10 Claims, 4 Drawing Sheets

(56) References Cited

U.S. PATENT DOCUMENTS

| | | | |
|---|---|---|---|
| 9,230,707 | B2 | 1/2016 | Chung et al. |
| 2006/0111008 | A1 | 5/2006 | Arthur et al. |
| 2006/0274049 | A1 | 12/2006 | Spath et al. |
| 2007/0074316 | A1* | 3/2007 | Alden .................. B82Y 30/00 257/784 |
| 2008/0259262 | A1 | 10/2008 | Jones et al. |
| 2010/0001971 | A1 | 1/2010 | Jiang et al. |
| 2010/0045610 | A1 | 2/2010 | Hong et al. |
| 2013/0126796 | A1 | 5/2013 | Chung et al. |
| 2014/0308524 | A1 | 10/2014 | Shim et al. |
| 2014/0338735 | A1 | 11/2014 | Allemand et al. |

FOREIGN PATENT DOCUMENTS

| | | |
|---|---|---|
| CN | 101656122 A | 2/2010 |
| CN | 103140899 A | 6/2013 |
| CN | 203165950 U | 8/2013 |
| CN | 105295554 A | 2/2016 |
| CN | 105932122 A | 9/2016 |
| KR | 10-2014-0028416 A | 3/2014 |

OTHER PUBLICATIONS

Notice of Transmittal of the International Search Report of PCT/CN2017/111047 in Chinese, dated Jan. 9, 2018.
Written Opinion of the International Searching Authority of PCT/CN2017/111047 in Chinese, dated Jan. 9, 2018 with English translation.
Choi et al., "Ag nanowire-embedded ITO films as a near-infrared transparent and flexible anode for flexible organic solar cells", Elsevier, Solar Energy Materials & Solar Cells, 110, 2013, pp. 147-153 (7 pages).
Byrne et al., "Recent Advances in Research on Carbon Nanotube-Polymer Composites", WILEY-VCH Verlag GmbH & Co. KGaA, Advanced Materials, 22, 2010, pp. 1672-1688 (17 pages).
English translation of Extended European Search Report in EP Application No. 17868502.0 dated Nov. 26, 2020.
Chinese Office Action in Chinese Application No. 201710154211.4, dated Dec. 28, 2020 with English translation.
Chinese Office Action in Chinese Application No. 201710154211.4, dated Apr. 23, 2020 with English translation.

* cited by examiner

CONDUCTIVE SUBSTRATE, MANUFACTURING METHOD THEREOF AND DISPLAY DEVICE

CROSS REFERENCE TO RELATED APPLICATIONS

This application is the National Stage of PCT/CN2017/111047 filed on Nov. 15, 2017, which claims priority under 35 U.S.C. § 119 of Chinese Application No. 201710154211.4 filed on Mar. 15, 2017, the disclosure of which is incorporated by reference.

TECHNICAL FIELD

At least one embodiment of the present invention relates to a conductive substrate, a manufacturing method thereof and a display device.

BACKGROUND

The flexible conductive substrate generally adopts a sputtering evaporation method, so that a conductive metal oxide and a polymer substrate can have good adhesion. For instance, the conductive metal oxide includes indium tin oxide (ITO). Among the conductive metal oxide, ITO has the relatively good transparency and conductivity, can exert extraordinarily high transparency and surface conductivity, has good mechanical and chemical properties, has good dimensional stability when heated, also has superior durability and excellent etching fabricability, and is often used as electrodes in the display field.

SUMMARY

At least one embodiment of the present disclosure provides a conductive substrate, a manufacturing method thereof and a display device, in order to improve the quality of the conductive substrate and the flexibly.

At least one embodiment of the present disclosure provides a conductive substrate, comprising a base substrate and a first conductive layer and a second conductive layer disposed on the base substrate, wherein the first conductive layer and the second conductive layer contact with each other; the first conductive layer is configured to be electrically connected with separated parts after the second conductive layer is fractured; and the first conductive layer includes a composite material layer or a nanowire conductive network layer.

At least one embodiment of the present disclosure provides a method for manufacturing a conductive substrate, comprising: forming a first conductive layer and a second conductive layer on a base substrate, in which the first conductive layer and the second conductive layer contact with each other; the first conductive layer is configured to be electrically connected with separated parts after the second conductive layer is fractured; the forming the first conductive layer includes forming a composite material layer or forming a nanowire conductive network layer.

At least one embodiment of the present disclosure provides a display device, comprising the conductive substrate provides by at least on embodiment of the present disclosure.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

Figure 1:
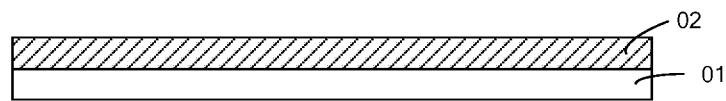
FIG. 1 is a sectional view of a conductive substrate.
Figure 2:
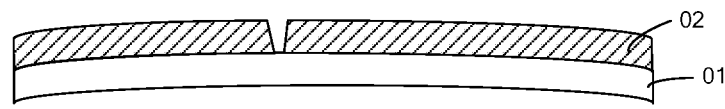
FIG. 2 is a sectional view illustrating a fracture of a conductive layer of a conductive substrate.

Most conductive metal oxide electrodes have large Young's modulus and poor flexibility. As shown in FIG. 1, the flexible conductive substrate comprises a base substrate 01 and a conductive layer 02. If the flexible conductive substrate adopts conductive metal oxide such as ITO as the conductive layer 02, the fracture of the conductive metal oxide may be easily caused in the bending process. As shown in FIG. 2, the electrical connection performance of the conductive layer 02 is reduced or the conductive layer 02 fails, and then the quality of the flexible conductive substrate can be affected.

Figure 3:
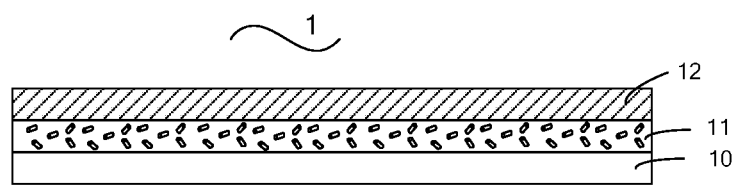
FIG. 3 is a sectional view of a conductive substrate provided by an embodiment of the present invention.
Figure 4:
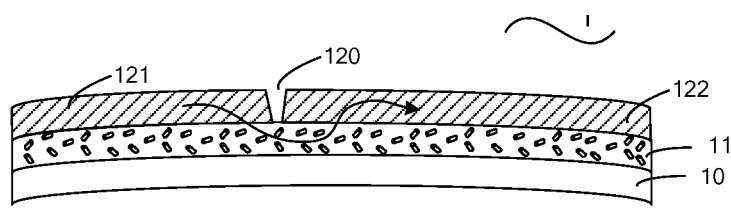
FIG. 4 is a sectional view illustrating a fracture of a second conductive layer of the conductive substrate provided by an embodiment of the present invention.

At least one embodiment of the present invention provides a conductive substrate 1, which, as shown in FIGS. 3 and 4, comprises a base substrate 10 and a first conductive layer 11 and a second conductive layer 12 disposed on the base substrate 10, wherein the first conductive layer 11 and the second conductive layer 12 contact with each other; the first conductive layer 11 is configured to be electrically connected with fractured parts after the second conductive layer 12 is broken; and the first conductive layer 11 includes a composite material layer or a nanowire conductive network layer. For instance, the conductive substrate may be a flexible conductive substrate, so the conductive substrate 1 is flexible and even foldable. For instance, the base substrate may adopt a flexible base substrate. Materials of the flexible base substrate, for instance, includes but not limited to polyethylene terephthalate, polyethylene, polypropylene, polystyrene or polycarbonate.

For instance, as shown in FIG. 4, the first conductive layer 11 and the second conductive layer 12 have overlap sections in a direction perpendicular to the base substrate 10.

Figure 5:
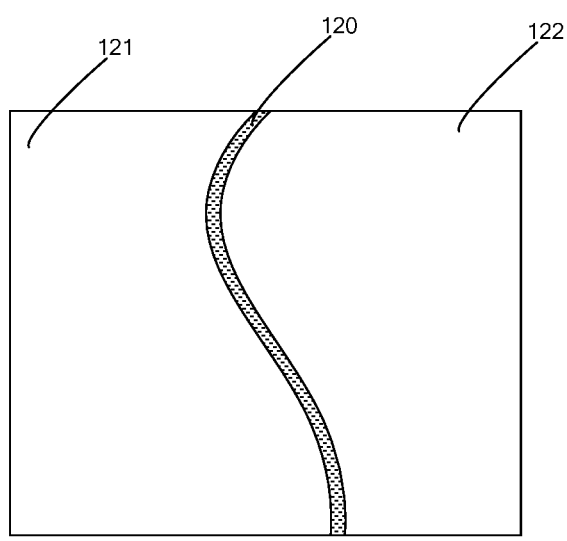
FIG. 5 is a schematic plan view illustrating a fracture of the second conductive layer of the conductive substrate provided by an embodiment of the present invention.

As shown in FIGS. 4 and 5, a crack 120 is formed after the fracture of the second conductive layer 12; the crack 120 divides the second conductive layer 12 into two parts: a first part 121 and a second part 122; and the first part 121 and the second part 122 are electrically connected with each other by using the first conductive layer 11 contacting with the second conductive layer 12.

Figure 6:
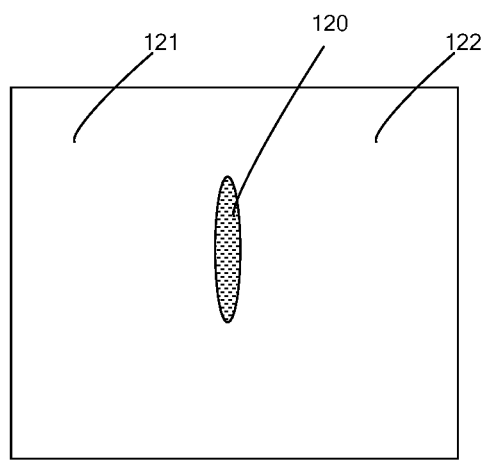
FIG. 6 is a schematic plan view illustrating a fracture of a second conductive layer of a conductive substrate provided by another embodiment of the present invention.

The first part 121 and the second part 122 as shown in FIG. 5 are completely separated and have no connecting part in the second conductive layer 12. The two parts divided from the second conductive layer 12 may also be, as shown in FIG. 6: the first part 121 and the second part 122 are only separated at the crack 120, and other parts may be electrically connected.

At least one embodiment of the present invention provides a conductive substrate 1. When the conductive substrate 1 is bent, even the second conductive layer 12 is broken, as the first conductive layer 11 clinging to the second conductive layer 12 has conductivity, fractured parts of the second conductive layer 12 may realize electrical conduction through the first conductive layer 11, so as to improve the quality of the conductive substrate, particularly the flexible conductive substrate, and increase the flexibility.

Description is given in the embodiment of the present invention by taking one crack as an example. The second conductive layer 12 may include a plurality of cracks.

In the conductive substrate provided by one embodiment of the present invention, the Young's Modulus of the first conductive layer 11 is less than that of the second conductive layer 12. Thus, when the conductive substrate is bent, the first conductive layer 11 with small Young's Modulus is not easy to be fractured and can have the connecting function when the second conductive layer 12 is fractured.

Figure 7:
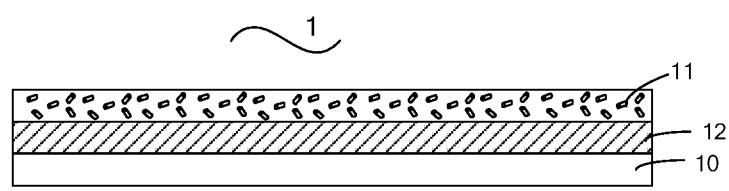
FIG. 7 is a sectional view of a conductive substrate provided by another embodiment of the present invention.
Figure 8:
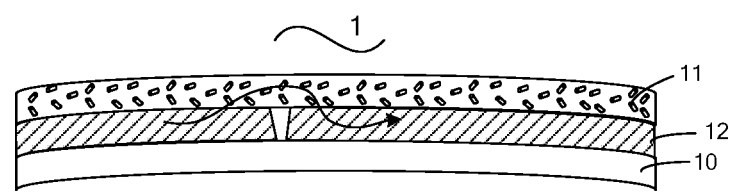
FIG. 8 is a schematic sectional view illustrating a fracture of a second conductive layer of the conductive substrate provided by another embodiment of the present invention.

In the conductive substrate as shown in FIGS. 3 and 4, the first conductive layer 11 is closer to the base substrate 10 than the second conductive layer 12. In the conductive substrate provided by another embodiment of the present invention, as shown in FIGS. 7 and 8, the first conductive layer 11 is farther away from the base substrate 10 than the second conductive layer 12. Thus, the second conductive layer 12 may be formed on the base substrate 10 at first, and then the first conductive layer 11 is formed.

Figure 9:
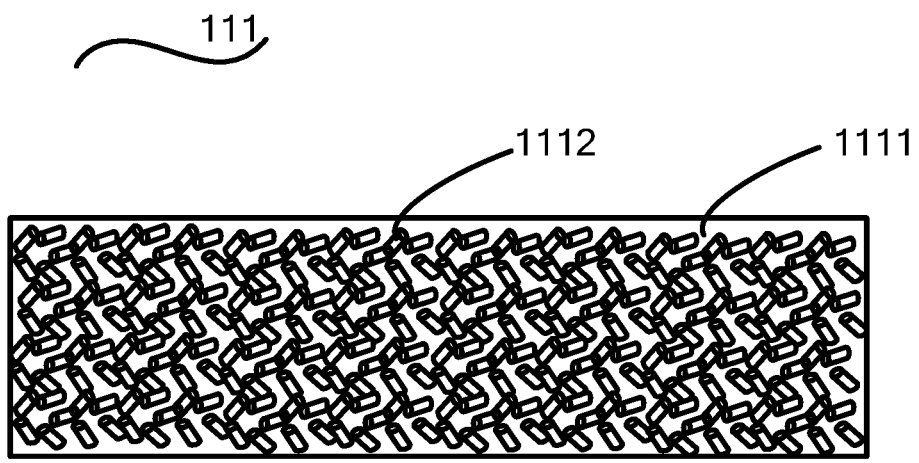
FIG. 9 is a plan view of a polymer carbon nanotube composite layer in an embodiment of the present invention.

In the conductive substrate provided by one embodiment of the present invention, as shown in FIG. 9, the composite material layer includes a polymer carbon nanotube composite layer 111. In the polymer carbon nanotube composite layer 111, carbon nanotubes 1112 are dispersed in polymers 1111. The polymer carbon nanotube composite layer 111 has good flexibility and is not easy to be fractured in the bending process of the conductive substrate.

Figure 10:
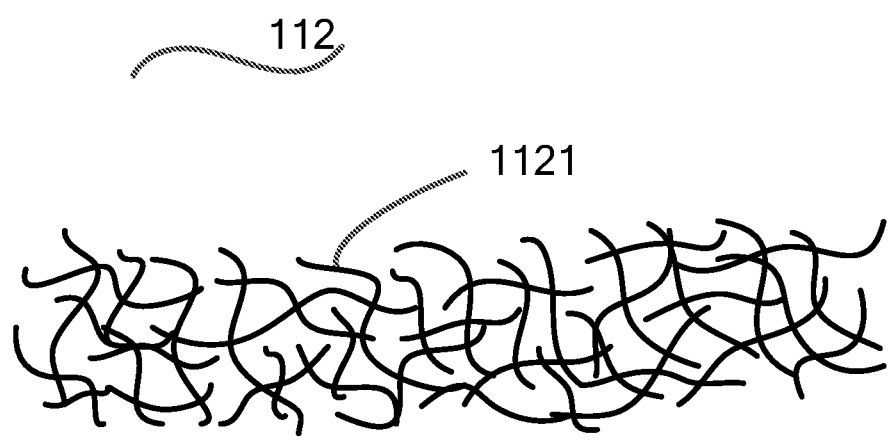
FIG. 10 is a plan view of a nanowire conductive network layer in another embodiment of the present invention.

In the conductive substrate provided by one embodiment of the present invention, as shown in FIG. 10, the first conductive layer 11 includes a nanowire conductive network layer 112. The nanowire conductive network layer 112 includes a plurality of randomly arranged nanowires 1121. The plurality of nanowires 1121 are intersected and lapped to form a network structure. Thus, the nanowire conductive network layer 112 is conductive, and the nanowire conductive network layer 112 with the network structure is not easy to be fractured.

Figure 11:
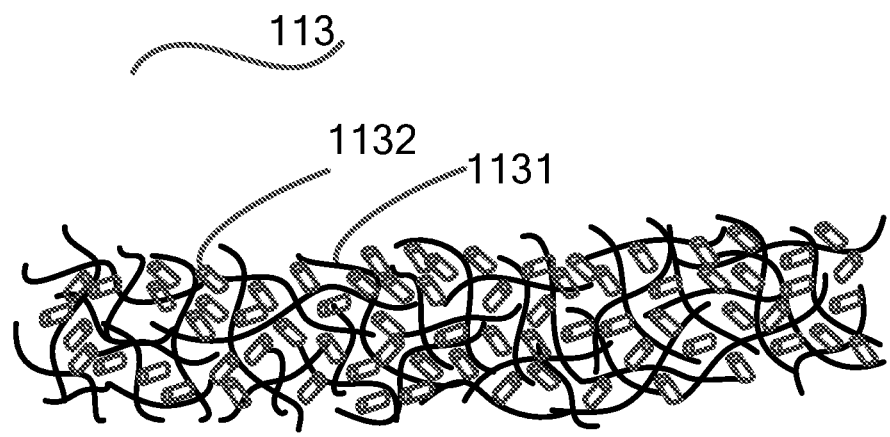
FIG. 11 is a plan view of a composite layer of nanowires and nanoparticles in still another embodiment of the present invention.

In the conductive substrate provided by an embodiment of the present invention, as shown in FIG. 11, the composite material layer includes a composite layer 113 of nanowires and nanoparticles. In the composite layer of nanowires and nanoparticles 113, the nanowires 1131 form a conductive network structure; the nanoparticles 1132 are filled into the conductive network structure formed by the nanowires 1131; and the conductive network structure is electrically connected with the nanoparticles 1132. The nanoparticles may fill gaps among adjacent nanowires, so as to enhance the conductivity of the conductive network structure. The nanoparticles are filled into the conductive network formed by the nanowires, play the role of a bridge for communicating the conductive network, and meanwhile, perform winding protection on nodes of the nanowires.

For instance, in order to allow the nanowires to have good conductivity, materials of both the nanowires 1121 and the nanowires 1131 may include at least one of silver, copper or gold. Materials of the nanoparticles may include at least one of silver, copper or gold. That is to say, in the composite layer of nanowires and nanoparticles and in the nanowire conductive network layer, the materials of the nanowires includes at least one of silver, copper or gold, and the materials of the nanoparticles in the composite layer of nanowires and nanoparticles includes at least one of silver, copper or gold.

For instance, the second conductive layer 12 may include an electrode layer and may be formed according to required patterns.

At least one embodiment of the present invention provides a method for manufacturing a conductive substrate, which comprises:

forming a first conductive layer 11 and a second conductive layer 12 on a base substrate 10, in which the first conductive layer 11 and the second conductive layer 12 contact with each other; the first conductive layer 11 is configured to be electrically connected with separated parts after the second conductive layer 12 is broken; and the first conductive layer 11 includes a composite material layer or a nanowire conductive network layer.

In the conductive substrate manufactured by the method for manufacturing the conductive substrate provided by at least one embodiment of the present invention, when the conductive substrate 1 is bent, even the second conductive layer 12 is fractured, as the first conductive layer 1 clinging to the second conductive layer 12 has conductivity, fractured positions of the second conductive layer 12 may realize electrical conduction through the first conductive layer 11, so as to improve the quality of the conductive substrate, particularly the flexible conductive substrate, and increase the flexibility.

In the method for manufacturing the conductive substrate, provided by an embodiment of the present invention, the composite material layer includes a polymer carbon nanotube composite layer 111, and a process of forming the polymer carbon nanotube composite layer 111 on the base substrate 10 includes the following steps:

forming hybrid dispersion by dispersing carbon nanotubes with hydrophilic groups introduced on its surface and hydrophilic polymers in a first liquid dispersant; and coating the hybrid dispersion on the base substrate 10, removing a liquid in the hybrid dispersion coated on the base substrate 10, and forming the polymer carbon nanotube composite layer.

Figure 12:
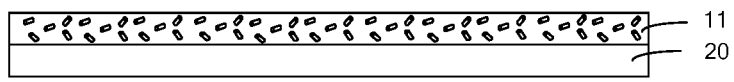
FIG. 12 is a sectional view illustrating forming a first conductive layer on a support substrate in an embodiment of the present invention.

In the method for manufacturing the conductive substrate, provided by an embodiment of the present invention, the step of forming the polymer carbon nanotube composite layer on the base substrate 10 includes:

forming hybrid dispersion by dispersing carbon nanotubes with hydrophilic groups introduced on its surface and hydrophilic polymers in a first liquid dispersant;

coating the hybrid dispersion on a support substrate 20, removing a liquid in the hybrid dispersion coated on the support substrate 20, and forming the polymer carbon nanotube composite layer on the support substrate 20, as shown in FIG. 12; and transferring the polymer carbon nanotube composite layer on the support substrate to the base substrate 10.

The method for manufacturing the conductive substrate, provided by an embodiment of the present invention, further comprises the step of performing hydrophilic treatment on the base substrate 10 before the above steps. For instance, the step of performing hydrophilic treatment on the base substrate 10 includes the following steps:

adopting UV light or plasmas to treat a surface of the base substrate 10, coating a coupling agent or hydrophilic polymers on the surface of the base substrate 10, and finishing the surface hydrophilic treatment of the base substrate 10, thus, which is a benefit for the polymer carbon nanotube composite layer to be subsequently formed on the base substrate 10. The coupling agent, for instance, includes a silane coupling agent.

In the method for manufacturing the conductive substrate provided by an embodiment of the present invention, the hydrophilic groups are introduced by adoption of acid to perform a surface treatment of the carbon nanotubes in order to form the carbon nanotubes with the hydrophilic groups introduced on the surface; and the acid includes at least one of formic acid, acetic acid, hydrogen peroxide, nitric acid or sulfuric acid. For instance, the weight ratio of the hydrophilic polymers to the carbon nanotubes is greater than 0.5 and less than 4. Moreover, for instance, in order to balance the material usage amount and performance of the polymer carbon nanotube composite layer, the weight ratio of the hydrophilic polymers to the carbon nanotubes is greater than 2 and less than 3. For instance, the concentration of the carbon nanotubes in the hybrid dispersion is greater than 0.1 g/L and less than 2.0 g/L. Furthermore, for instance, in order to balance the material usage amount and the performances of the polymer carbon nanotube composite layer, the concentration of the carbon nanotubes in the hybrid dispersion may be greater than 0.6 g/L and less than 1.4 g/L.

In the method for manufacturing the conductive substrate provided by an embodiment of the present invention, the hydrophilic groups may include at least one of hydroxyl (—OH), carboxyl (—COOH), amino (—NH2) or sulfonic acid (—SO3H); the hydrophilic polymers may include polymers with $\pi$ conjugated skeleton; and the polymers with $\pi$ conjugated skeleton may include phenylenevinylidene, vinylidene, thienylene, pyrrolylene, phenylene, iminophenylene, isothioindene, furylene or carbazolyl repeat units.

For instance, the polymer carbon nanotube composite layer may be transparent or opaque. The thickness is about 10 nm-1 μm or greater than 1 μm. The thickness may be specifically set according to conductive demands and is not limited here.

The carbon nanotubes may be single-layer carbon nanotubes or multi-layer carbon nanotubes. The diameter and the length of the carbon nanotubes are not specifically limited. The carbon nanotubes may be basically obtained by any method. The specific examples of the synthesis method include laser ablation, arc discharge and chemical vapor deposition (CVD).

For instance, the first liquid dispersant includes water, alcohols, ketones, amides, pyrrolidones, hydroxy esters and anilines. For instance, the alcohols include glycols or propandiols. The first liquid dispersant is not specifically limited, as long as the carbon nanotubes and the hydrophilic polymers may be dispersed in the first liquid dispersant.

For instance, in the process of forming the polymer carbon nanotube composite layer, coating includes spin coating or printing method. The printing method may include photogravure printing, flexographic printing, lithographic printing, letterpress printing, offset printing, gravure printing, rubber printing and screen printing.

In the method for manufacturing the conductive substrate provided by an embodiment of the present invention, the step of forming the nanowire conductive network layer on the base substrate 10 includes:

forming nanowire dispersion by dispersing nanowires in a second liquid dispersant;

coating the nanowire dispersion on the base substrate 10; and removing a liquid in the nanowire dispersion coated on the base substrate 10, and obtaining the nanowire conductive network layer.

In the method for manufacturing the conductive substrate provided by an embodiment of the present invention, the step of forming the nanowire conductive network layer on the base substrate 10 includes:

forming nanowire dispersion by dispersing nanowires in a second liquid dispersant;

coating the nanowire dispersion on a support substrate;

removing a liquid in the nanowire dispersion coated on the support substrate, and forming the nanowire conductive network layer on the support substrate; and transferring the nanowire conductive network layer on the support substrate to the base substrate 10.

In the method for manufacturing the conductive substrate provided by an embodiment of the present invention, in the process of forming the nanowire conductive network layer, the weight percentage of the nanowires in the nanowire dispersion may be 0.1%-2%.

In the method for manufacturing the conductive substrate provided by an embodiment of the present invention, the step of forming the composite layer of nanowires and nanoparticles on the base substrate 10 includes:

forming a nanowire conductive network structure on the base substrate 10; and forming nanoparticles in grids of the nanowire conductive network structure, in which the conductive network structure is electrically connected with the nanoparticles.

In the method for manufacturing the conductive substrate provided by an embodiment of the present invention, the composite material layer includes a composite layer of nanowires and nanoparticles, and the step of forming the composite layer of nanowires and nanoparticles on the base substrate 10 includes:

forming a nanowire conductive network structure on a support substrate;

forming nanoparticles in grids of the nanowire conductive structure, and forming the composite layer of nanowires and nanoparticles on the support substrate, in which the conductive network structure is electrically connected with the nanoparticles; and transferring the composite layer of nanowires and nanoparticles on the support substrate to the base substrate 10.

In the method for manufacturing the conductive substrate provided by an embodiment of the present invention, the step of forming the nanoparticles in the grids of the nanowire conductive network structure includes: coating one layer of nanoparticle dispersion on the nanowire conductive network structure, removing a liquid in the nanoparticle dispersion coated on the nanowire conductive network structure, and filling the nanoparticles into the conductive network structure formed by the nanowires.

In the method for manufacturing the conductive substrate provided by an embodiment of the present invention, in the process of forming the composite layer of nanowires and nanoparticles, the weight percentage of the nanoparticles in the nanoparticle dispersion is 0.1%-3%.

Figure 13:
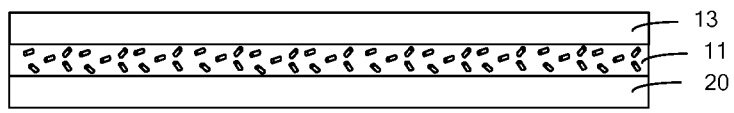
FIG. 13 is a sectional view illustrating forming an optical adhesive layer after forming the first conductive layer on the support substrate in an embodiment of the present invention.
Figure 14:
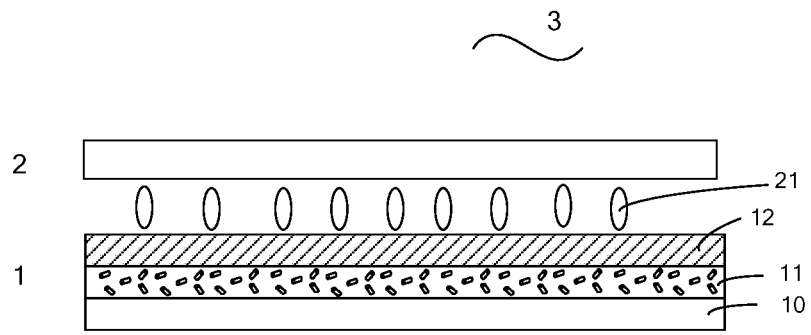
FIG. 14 is a sectional view of a display device provided by an embodiment of the present invention.

For instance, as shown in FIG. 13, the first conductive layer 11 may be formed on the support substrate 20 at first, and then an optical adhesive layer 13 is formed thereon. The first conductive layer 11 may be transferred to the base substrate 10 through the optical adhesive layer 13. The optical adhesive layer 13 may be disposed between the base substrate 10 and the first conductive layer 11. And subsequently, the second conductive layer 12 is formed on the first conductive layer 11.

For instance, the viscosity of the optical adhesive may be less than 2000 CPS and may be one of optical UV adhesive, gel or epoxy adhesive. The UV adhesive adopts UV curing. The gel and the epoxy adhesive adopt room-temperature curing or curing after raising the temperature to 50-70° C. After curing, the optical adhesive may be stripped off from the support substrate 20 together with the first conductive layer 11.

For instance, baking method may be adopted to remove the liquid in the hybrid dispersion and the nanowire dispersion coated on the base substrate 10 or the support substrate 20, and the liquid in the nanoparticle dispersion coated on the nanowire conductive network structure. For instance, the heating temperature may be 70-90° C., and the baking time may be 25-35 s.

For instance, the second liquid dispersant includes ethanol, water, isopropanol, methanol, acetone or methylene chloride solution.

For instance, in the process of forming the composite layer of nanowires or nanoparticles or forming the nanowire conductive network layer, the size of the nanowire may be: L=5-100 μm (length) and D=20-100 nm (diameter); and the weight percentage of the nanowires in the nanowire dispersion may be 0.1%-2%.

For instance, in the process of forming the composite layer of nanowires and nanoparticles, the weight percentage of the nanowires in the nanowire dispersion may be 0.1%-3%, and the size of the nanoparticle may be 5-50 nm. Moreover, for instance, in the process of forming the composite layer of nanowires and nanoparticles, the weight percentage of the nanowires in the nanoparticle dispersion may be 0.1%-2%.

The composite layer of nanowires or nanoparticles and the nanowire conductive network layer have the following advantages: good flexibility, high transmittance, low resistance, good adhesion and low price.

At least one embodiment of the present invention provides a display device 3, which comprises any conductive substrate 1 provided by the embodiment of the present invention.

For instance, the display device is a liquid crystal display (LCD) device and further comprises an opposed substrate 2 arranged opposite to the conductive substrate 1, and a liquid crystal layer 21 disposed between the conductive substrate 1 and the opposed substrate 2. The conductive substrate 1 may be an array substrate of the LCD device. But the structure of the LCD device is not limited thereto.

For instance, the display device may also be a light-emitting diode (LED) display device.

When the flexible base substrate is adopted, the display device may be bent and folded, and the fractured positions of the second conductive layer 12 may realize electrical conduction through the first conductive layer 11. Thus, the quality of the conductive substrate can be improved, and the flexibility can be increased.

The second conductive layer 12 may be taken as pixel electrodes and common electrodes of the LCD device or cathodes and anodes of the LED display device, and may also be taken as at least one of touch electrodes in a touch display device. No limitation will be given here in the embodiment of the present invention.

Although the nanowire conductive network layer and the nanoparticles adopt different reference numbers of the accompanying drawings in the description of the conductive substrate 1, the nanowire conductive network layer and the nanoparticles may be same matters. In the manufacturing method of the conductive substrate 1, the nanowire conductive network layer and the conductive network structure in the composite layer of nanowires and nanoparticles may be prepared by the same method.

For instance, composite materials in the composite material layer, for instance, refer to two or more than two materials with different properties, and are materials formed in macroscopic (microscopic) view by physical or chemical methods, and the material may have new performances. In the embodiments of the present invention, in the composite layer of nanowires and nanoparticles, the nanowires and the nanoparticles may adopt the same material and may also adopt different materials. For instance, both adopt Ag, or one adopts Ag and the other adopts Cu. The composite layer of nanowires and nanoparticles is referred to as a composite material due to difference in form and performance of the nanowires and the nanoparticles.

The following statements should be noted:

(1) Unless otherwise defined, the same reference number is denoted as the same meaning in the embodiments of the accompanying drawings of the present disclosure.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged, that is, the accompanying drawings are not drawn according to the actual scale. However, it should understood that, in the case in which a component or element such as a layer, film, region, substrate or the like is referred to be "on" or "under" another component or element, it may be directly on or under the another component or element or a component or element is interposed therebetween.

(4) In case of no conflict, features in one embodiment or in different embodiments can be combined.

What are described above is related to the specific embodiments of the disclosure only and not limitative to the scope of the disclosure. The protection scope of the disclosure shall be based on the protection scope of the claims.

The invention claimed is:

1. A conductive substrate, comprising a base substrate and a first conductive layer and a second conductive layer disposed on the base substrate,
    wherein the first conductive layer and the second conductive layer contact with each other;
    the first conductive layer is configured to be electrically connected with separated parts after the second conductive layer is fractured; and
    the first conductive layer includes a composite material layer, the composite material layer includes a polymer carbon nanotube composite layer, and
    in the polymer carbon nanotube composite layer, a weight ratio of the polymers to the carbon nanotubes is greater than 0.5 and less than 4.

2. The conductive substrate according to claim 1, wherein a Young's modulus of the first conductive layer is less than that of the second conductive layer.

3. The conductive substrate according to claim 1, wherein the conductive substrate is a flexible conductive substrate.

4. A display device, comprising the conductive substrate according to claim 1.

5. A method for manufacturing a conductive substrate, comprising:
    forming a first conductive layer and a second conductive layer on a base substrate, in which the first conductive layer and the second conductive layer contact with each other; the first conductive layer is configured to be electrically connected with separated parts after the second conductive layer is fractured; the forming the first conductive layer includes forming a composite material layer,
    wherein the forming the composite material layer includes forming a polymer carbon nanotube composite layer on the base substrate,
    in the polymer carbon nanotube composite layer, a weight ratio of the polymers to the carbon nanotubes is greater than 0.5 and less than 4.

6. The method for manufacturing the conductive substrate according to claim 5, wherein
    the forming the polymer carbon nanotube composite layer on the base substrate includes:
    forming a hybrid dispersion by dispersing carbon nanotubes with hydrophilic groups introduced on surfaces of the carbon nanotubes and hydrophilic polymers in a first liquid dispersant; and
    coating the hybrid dispersion on the base substrate, removing a liquid in the hybrid dispersion coated on the base substrate, to form the polymer carbon nanotube composite layer.

7. The method for manufacturing the conductive substrate according to claim 6, wherein a concentration of the carbon nanotubes in the hybrid dispersion is greater than 0.1 g/L and less than 2.0 g/L.

8. The method for manufacturing the conductive substrate according to claim 6, wherein the hydrophilic groups are introduced by adoption of acid to treat the surfaces of the carbon nanotubes to form the carbon nanotubes with the hydrophilic groups introduced on surfaces of the carbon nanotubes; and the acid includes at least one of formic acid, acetic acid, hydrogen peroxide, nitric acid or sulfuric acid.

9. The method for manufacturing the conductive substrate according to claim 8, wherein the hydrophilic group includes at least one of at least one of hydroxyl (—OH), carboxyl (—COOH), amino (—NH$_2$) or sulfonic acid (—SO$_3$H), the hydrophilic polymers include polymers with π conjugated skeleton, and the polymers with the π conjugated skeleton includes phenylenevinylidene, vinylidene, thienylene, pyrrolylene, phenylene, iminophenylene, isothioindene, furylene or carbazolyl repeat units.

10. The method for manufacturing the conductive substrate according to claim 5, wherein
    the forming the polymer carbon nanotube composite layer on the base substrate includes:
    forming a hybrid dispersion by dispersing carbon nanotubes with hydrophilic groups introduced on surfaces of the carbon nanotubes and hydrophilic polymers in a first liquid dispersant;
    coating the hybrid dispersion on a support substrate, removing a liquid in the hybrid dispersion coated on the support substrate, and forming the polymer carbon nanotube composite layer on the support substrate; and
    transferring the polymer carbon nanotube composite layer on the support substrate to the base substrate.

* * * * *